US007880461B2

(12) United States Patent
Kim

(10) Patent No.: US 7,880,461 B2
(45) Date of Patent: Feb. 1, 2011

(54) SYSTEM FOR TRANSFERRING TEST TRAYS AND A HANDLER HAVING SAME

(75) Inventor: Yong Sun Kim, Suwon-si (KR)

(73) Assignee: Mirae Corporation, Cheonan-si (KR)

( * ) Notice: Subject to any disclaimer, the term of this patent is extended or adjusted under 35 U.S.C. 154(b) by 221 days.

(21) Appl. No.: 12/119,556

(22) Filed: May 13, 2008

(65) Prior Publication Data

US 2008/0284412 A1    Nov. 20, 2008

(30) Foreign Application Priority Data

May 18, 2007    (KR)    ...................... 10-2007-0048412

(51) Int. Cl.
*G01R 31/00*    (2006.01)
(52) U.S. Cl. .................................. 324/158.1
(58) Field of Classification Search ........................ None
See application file for complete search history.

(56) References Cited

U.S. PATENT DOCUMENTS 5,307,011 A * 4/1994 Tani ......................... 324/158.1
5,313,156 A * 5/1994 Klug et al. ................ 324/158.1
6,751,885 B2 * 6/2004 Franzoni et al. ................ 34/77
7,185,603 B2 * 3/2007 Correa et al. ................ 119/6.8
7,481,640 B1 * 1/2009 Jordan ........................ 425/110

FOREIGN PATENT DOCUMENTS

KR    20-0133514    10/1998
KR    100223093    7/1999

* cited by examiner

*Primary Examiner*—Paresh Patel
(74) *Attorney, Agent, or Firm*—KED & Associates, LLP

(57) ABSTRACT

A system and method is provided for transferring multiple test trays within a test handler. The system includes at least one moving member having a pushing member that pushes a first test tray and a pulling member that pulls on a projection on a second test tray to move the first and second test trays simultaneously with the moving member. The system also includes a second plate to which the at least one moving member is fixed, and a first plate to which the second plate is movably fixed. A handler may be equipped with this system so that two test trays may be moved at the same time to decrease overall processing time and improve efficiency and productivity of the handler.

11 Claims, 9 Drawing Sheets

SYSTEM FOR TRANSFERRING TEST TRAYS AND A HANDLER HAVING SAME

BACKGROUND

1. Field

This relates to a handler, and more particularly, to an apparatus for transferring a test tray containing packaged chips to be tested that may be used with a handler.

2. Background

A handler puts packaged chips through a final electrical test at the conclusion of a packaging process to detect failures prior to shipment. After completion of the final electrical test, the packaged chips are shipped as finished semiconductor devices. The handler transfers packaged chips from a user tray to a test tray, and supplies the test tray containing the packaged chips to a tester including a test board with a plurality of sockets. The handler brings the packaged chips loaded in the test tray into contact with individual sockets of the test board to perform electrical tests on the packaged chips. After sorting the packaged chips according to test results, the handler transfers the tested packaged chips from the test tray to corresponding user trays.

The handler may include first, second, and third chambers. Packaged chips in the test tray may be heated to extremely high temperature or cooled to extremely low temperature in the first chamber, may be tested in the second chamber, and may be cooled or heated to room temperature in the third chamber. The packaged chips in the test tray may go through the first, second, and third chambers in this order. This sequential processing of packaged chips may increase transfer and processing time, and decrease efficiency of the handler.

BRIEF DESCRIPTION OF THE DRAWINGS

The embodiments will be described in detail with reference to the following drawings, in which like reference numerals refer to like elements, wherein.

DETAILED DESCRIPTION

Reference will now be made in detail to embodiments as broadly described herein, examples of which are illustrated in the accompanying drawings.

Figure 1:
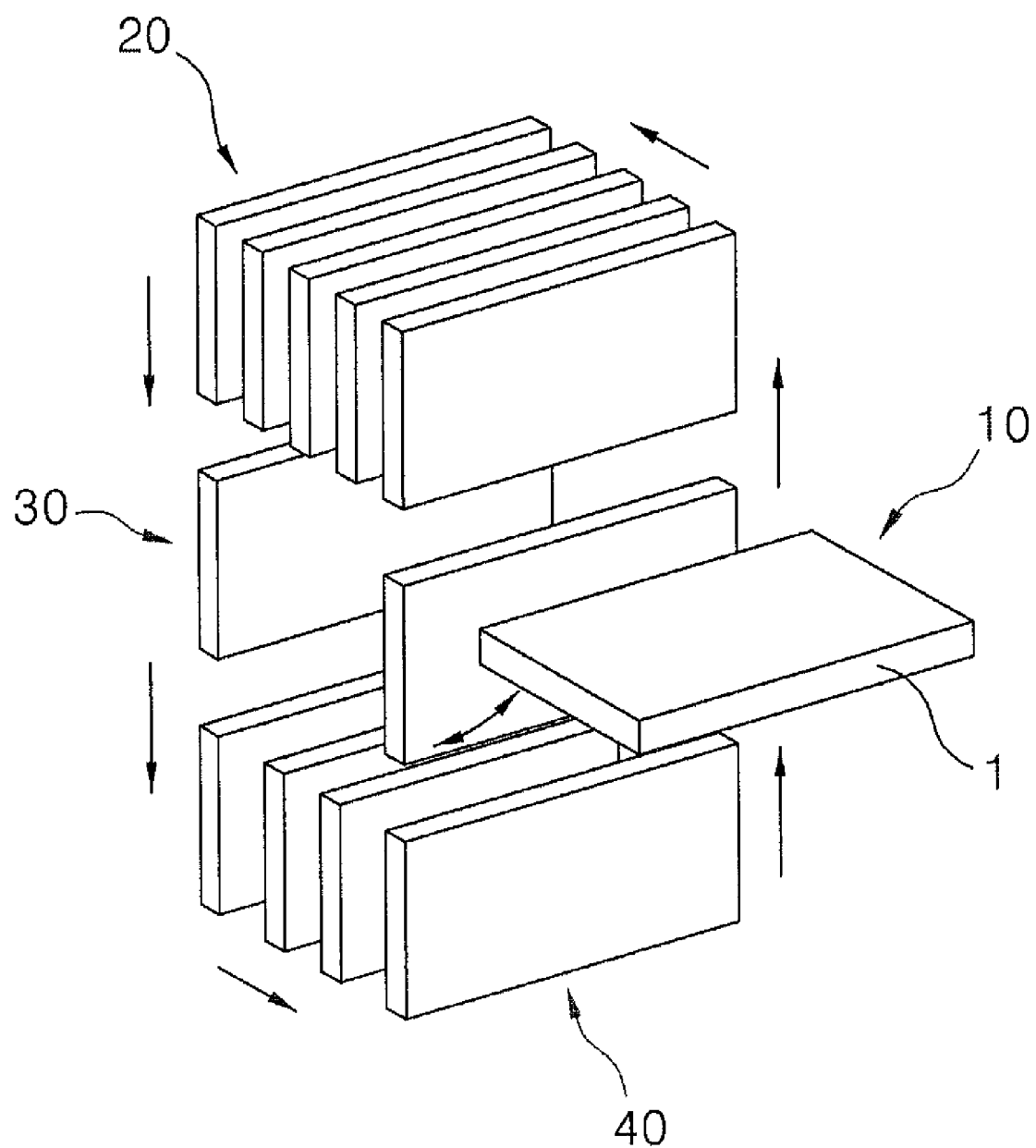
FIG. 1 is a schematic illustration of a path which a test tray follows while going through first, second, and third chambers of an exemplary handler.

FIG. 1 illustrates a path which a test tray may follow through the first, second, and third chambers of an exemplary handler. The exemplary handler may include a rotating unit 10, a first chamber 20, a second chamber 30, and a third chamber 40. The first chamber 20 may be located over the second chamber 30, and the third chamber 40 may be located below the second chamber 30. A test tray 1, containing packaged chips to be tested, may be rotated by 90 degrees to an upright position by the rotating unit 10, and be processed through the first, second, third chambers 20, 30 and 40. The packaged chips may be heated or cooled to an extremely high or low temperature while the upright-positioned test tray 1 moves forward within the first chamber 20. The upright-positioned test tray 1 may be transferred from the first chamber 20 into the second chamber 30 for electrical testing within the second chamber 30. The upright-positioned test tray 1 may be transferred from the second chamber 30 into the third chamber 40, where they may be cooled or heated to room temperature.

After processing through the first, second and third chambers 20, 30 and 40, the upright-positioned test tray 1 may be transferred to the rotating unit 10, which rotates the upright-positioned test tray 1 by 90 degrees to the horizontal position. After sorting, the tested packed chips may be unloaded from the test tray 1 to an appropriate user tray based on test results.

In the handler shown in FIG. 1, test trays 1 are sequentially transferred within the first, second, and third chambers 20, 30 and 40. In an instance in which a large number of test trays are to be sequentially processed, a first test tray, rotated by the rotating unit 10 to the upright position, waits to be transferred into the first chamber 20, while a second test tray waits to be transferred to the rotating unit 10 after the tested packaged chips are cooled or heated to room temperature within the third chamber 40. In this situation, the first test tray must first be transferred into the first chamber 20 before the second test tray may be transferred to the rotating unit 10. Thus, the second test tray may incur a significant amount of wait time, thereby increasing transfer and processing time.

Figure 2A:
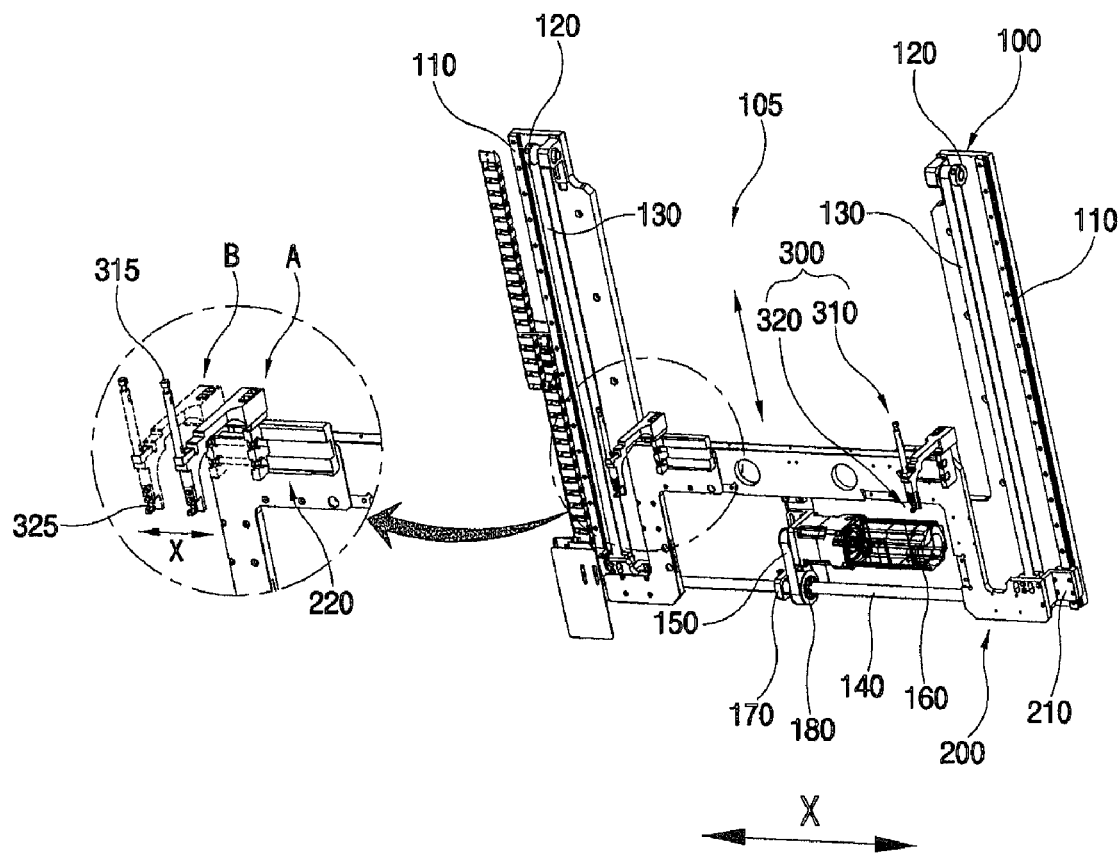
FIGS. 2A-2B are perspective views of an apparatus for transferring test trays according to an embodiment as broadly described herein.
Figure 2B:
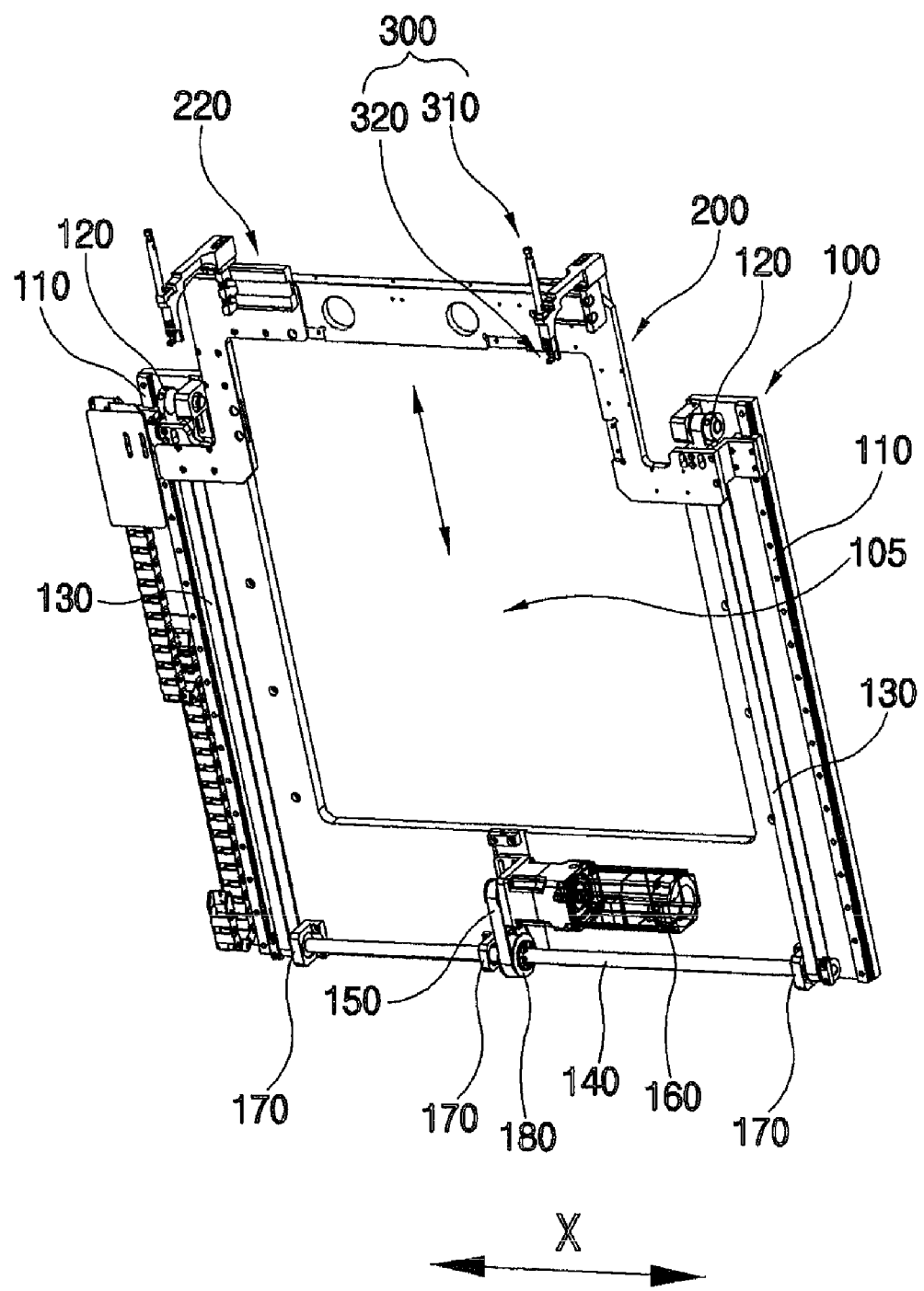

As shown FIGS. 2A and 2B, an apparatus for transferring test trays as embodied and broadly described herein may include a first plate 100, a second plate 200, and a moving member 300. The first plate 100 may support the second plate 200 and the moving member 300, and may guide motion of the second plate 200. The first plate 100 may be U-shaped, and may include an opening 105 through which a rotating unit 400 (see FIGS. 4A-4C) may rotate a test tray by 90 degrees. For example, the rotating unit 400 may rotate a test tray from a horizontal position to an upright position.

Linear motion (LM) guides 110 that guide motion of the second plate 200 may be provided at opposite ends of the first plate 100. One or both of the LM guides 100 may include a stopper (not shown) at one end thereof. A pulley 120 may be provided at opposite ends of the first plate 100. First belts 130 may extend between the pulleys 120 and a rotating rod 140. The first belts 130 may be fixed to the second plate 200 so that the second plate 200 ascends or descends as the first belts 130 rotate.

A second belt 150 may extend between a circular plate 180 provided at a central portion of the rotating rod 140 and a motor 160. Rotation of the motor 160 causes the second belt 150 to rotate, which in turn rotates the rotating rod 140. Rotation of the rotating rod 140 rotates the first belts 130, which in turn moves the second plate 200 up or down. Thus, this single motor 160 may rotate the first belts 130 at the same speed through the rotating rod 140, thereby permitting the second plate 200 to uniformly ascend and descend without any appreciable tiling or misalignment. One or more bearing brackets 170 may be provided with the first plate 100 to support the rotating rod 140. The second plate 200 may ascend and descend along the LM guides 110 while supporting the moving member 300. The second plate 200 may include LM blocks 210 that engage with the LM guides 110 to allow the second plate 200 to ascend and descend along the LM guides 110 on the first plate 100 as the first belts 130 rotate.

A mechanical actuator 220 including, for example, a pneumatic cylinder or a hydraulic cylinder and a connecting rod connected to the moving member 300 (not shown in detail in FIGS. 2A-2B) may be provided with the second plate 200 to generate a linear force through a linear stroke that is imparted on the moving member 300. The moving member 300 vertically ascends and descends with the second plate 200, and the mechanical actuator 220 moves the moving member 300 horizontally, i.e., in the X direction, relative to the second plate 200.

In certain embodiments, a plurality of moving members 300 and a plurality of mechanical actuators 220 may be provided with the second plate 200. For example, as shown in FIG. 2A, two moving members 300 and two mechanical actuators 220 may be provided with the second plate 200. The moving member 300 may be used to transfer first and second test trays T1 and T2 at the same time (see FIG. 4C). As the moving member 300 is connected to the second plate 200, the moving member 300 moves up and down together with the second plate 200, thus also moving the first and second test trays T1 and T2 together with the second plate 200.

Figure 3:
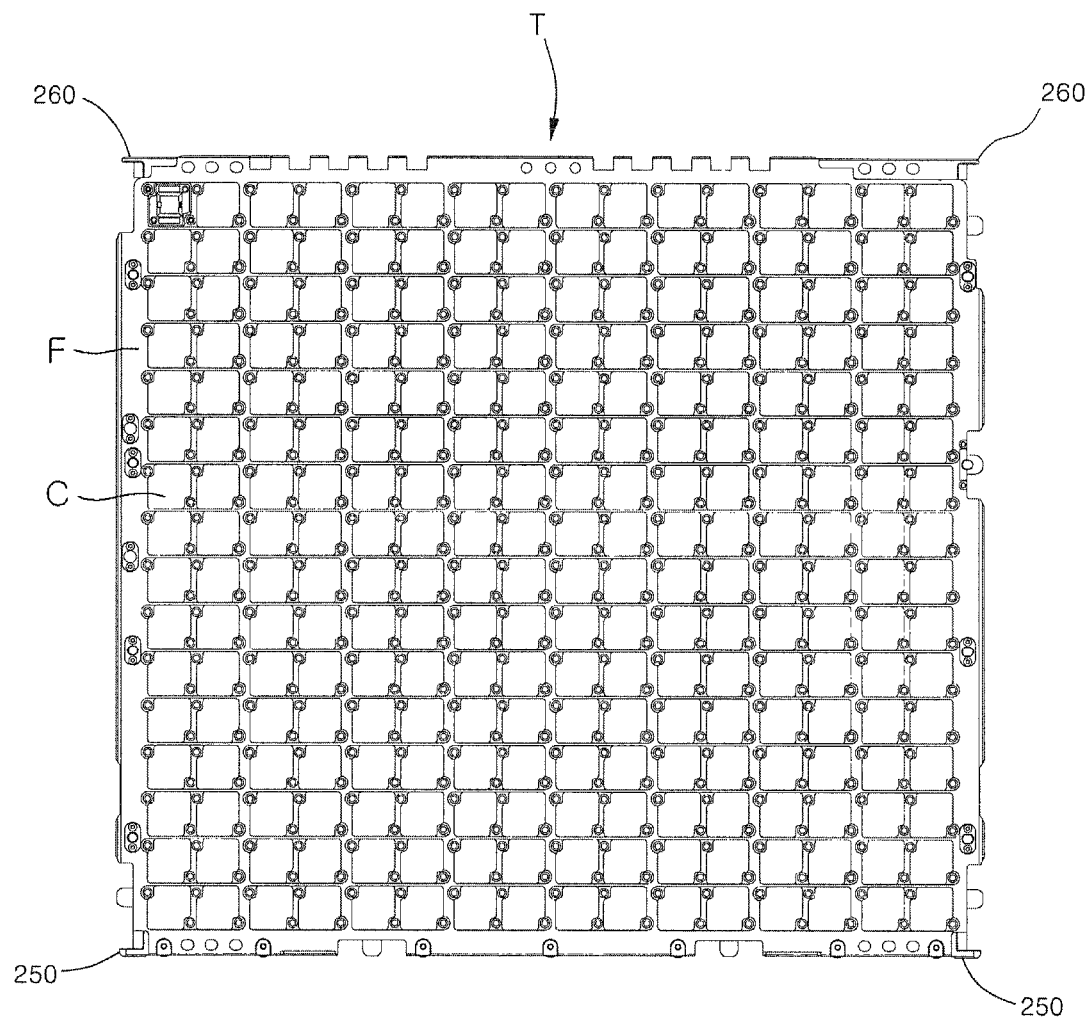
FIG. 3 is a front view of a test tray according to an embodiment as broadly described herein.

Each moving member 300 may include a pushing member 310 and a pulling member 320. The pushing and pulling members 310 and 320 may be used to transfer the first and second test trays T1 and T2, respectively. The pushing member 310 may include a head 315 which comes in contact with a contacting side 250 of the first test tray T1. The pulling member 320 may include a pocket 325 on which a projection 260 of the second test tray T2 rests. As shown in FIG. 3, each test tray T may include a frame F and two or more carriers C connected to the frame F to receive packaged chips. The frame F may include a contacting side 250 that contacts the head 315 of the pushing member 310 and a projection 260 which rests on the pocket 325 of the pulling member 320.

As the second plate 200 ascends, the pushing and pulling members 310 and 320 ascend at the same time, and the pushing member 310 pushes the first test tray T1 upward, with the head 315 of the pushing member 310 in contact with the contacting side 250 of the first test tray T1. At the same time, the pulling member 320 pulls the projection 260 of the second test tray T2 upward to move the second test tray T2 upward, with the projection 260 of the second test tray T2 resting on the pocket 325 of the pulling member 320. In this way, the first and second test trays T1 and T2 may be moved up at the same time.

The rotation unit 400 may rotate the first test tray into a transferring space via the opening 105. The transferring space is an area where the first and second test trays may be staged for transfer by the moving member 300. To prevent first test tray from colliding with the moving member 300 when it is rotated into the transferring space, the moving member 300 may be moved horizontally, i.e., in the X direction. Thus, when transferring the first and second test trays, the moving member 300 may initially be positioned at a first position A between the first and second test trays, and in particular, between the edge of the first test tray including the contacting side 250 and the edge of the second test tray including the projection 260.

Before the first test tray is rotated into the transferring space, the moving member 300 may be moved to a second position B adjacent to the first position A. After the moving member 300 is moved to the second position B, the first test tray can be rotated into the transferring space without colliding with the moving member 300. After the first test tray is rotated into the transferring space, the moving member 300 may be moved back to the first position A.

In a case in which two moving members 300 are provided with the second plate 200, the two moving members 300 may move horizontally away from each other, as far apart as possible, to permit the first test tray to freely enter the transferring space. The two moving members 300 may move closer to each other to hold the first test tray firmly in place within the transferring space after the first test tray has been rotated into the transferring space. The mechanical actuators 220 on the second plate 200 enable the two moving members 300 to move away from each other and toward each other in this manner.

Figure 4A:
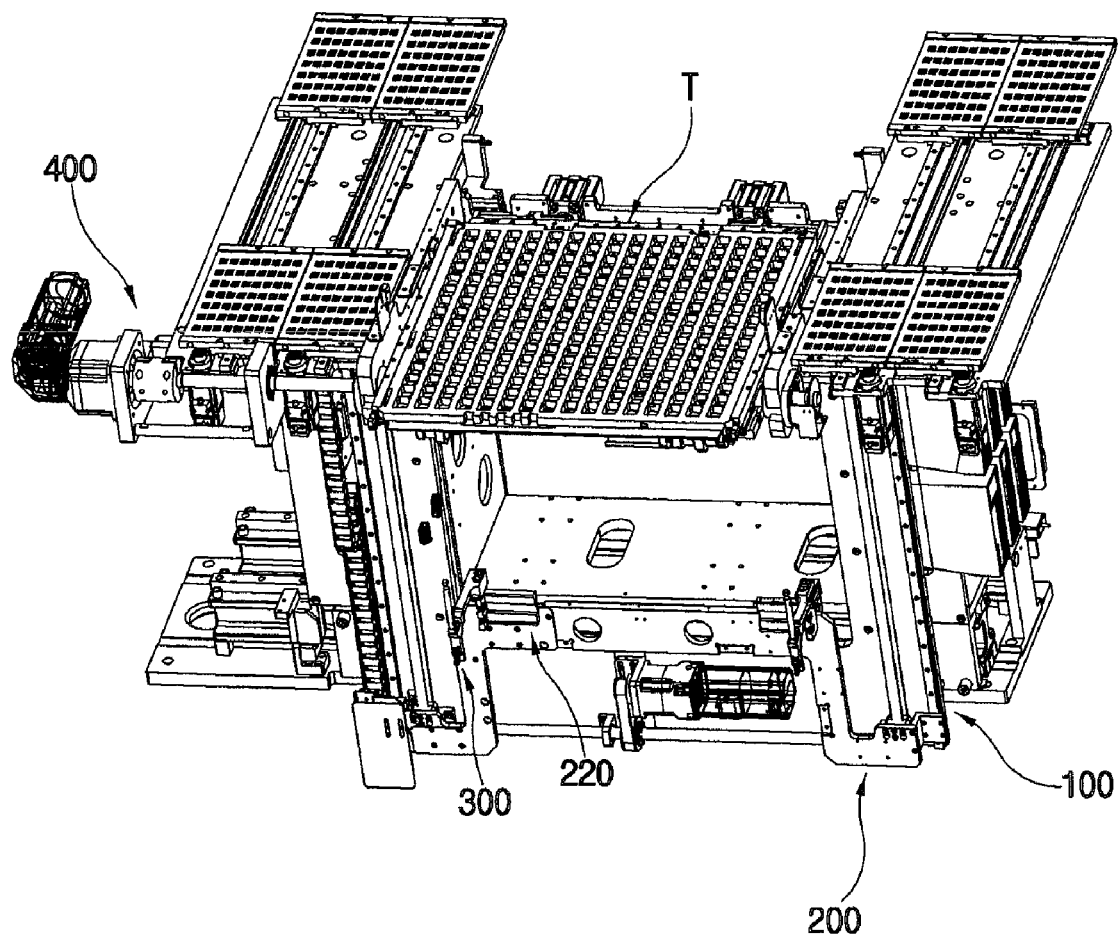
FIG. 4A is a front perspective view of an apparatus for transferring a test tray, showing the test tray coupled to a rotating unit, with the test tray in an un-rotated position.

More specifically, as shown in FIG. 4A, the mechanical actuators 220 move the moving members 300 horizontally, one to the right and the other to the left, as far apart from each other as possible. This is done to prevent the two moving members 300 from colliding with the first test tray when as it enters the transferring space.

Figure 4B:
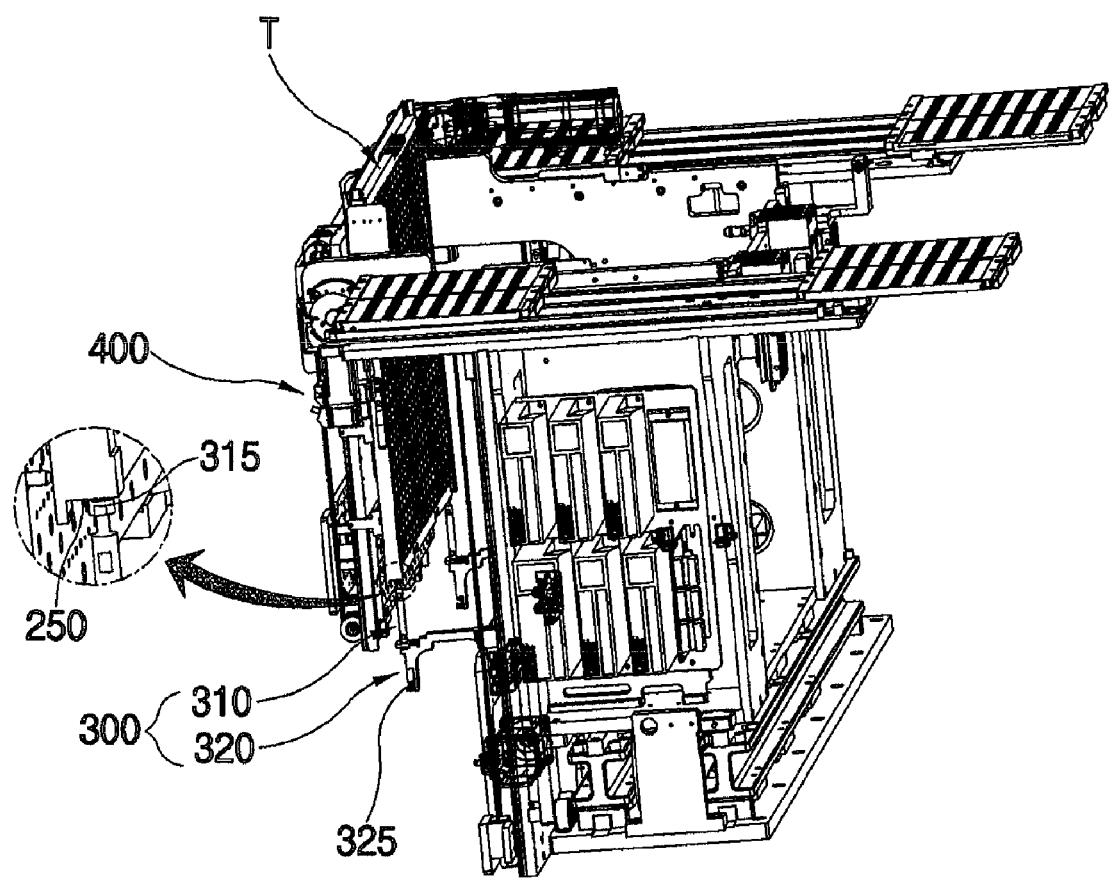
FIG. 4B is a side perspective view of the apparatus shown in FIG. 4A, with the test tray in a rotated position.
Figure 4C:
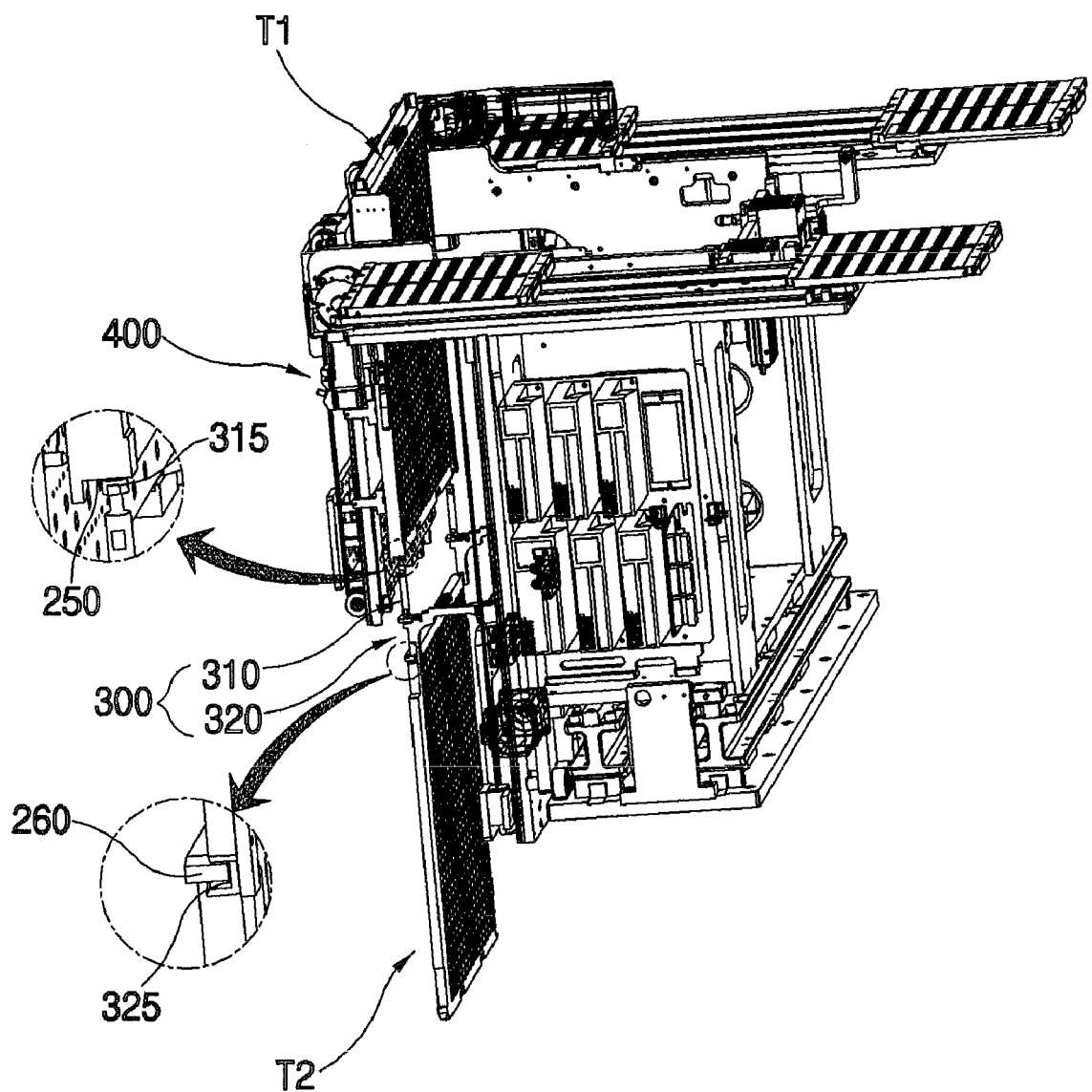
FIG. 4C is a perspective view of the apparatus shown in FIGS. 4A-4B, handling multiple test trays.

In FIGS. 4A and 4B, simply for ease of illustration, only one test tray T, which has been rotated by the rotating unit 400 into the transferring space, is shown. The second test tray (not shown) would be transferred through the opening 105 into the transferring space from the third chamber.

The first test tray T1 is rotated 90 degrees by the rotating unit 400 into the transferring space, and the second test tray T2 is transferred into the transferring space within the third chamber. The mechanical actuators 220, provided on the second plate 200, move one of the moving members 300 to the left and the other to the right so that the head 315 of the pushing member 310 contacts the contacting side 250 of the first test tray T1 and the projection 260 of the second test tray T2 rests on the pocket 325 of the pulling member 320.

Next, the second plate 200 (as shown in FIG. 2B) is moved up to move the pushing member 310 and the pulling member 320 up. The pushing member 310 and the pulling member 320, in turn, move the first and second test trays T1 and T2 up at the same time. The rotating rod 140 is rotated to rotate the first belts 130, which moves the LM blocks 210 connected to the second plate 200 up, thus moving the second plate 200 up.

After the first and second test trays T1 and T2 are moved up, the mechanical actuators 220 move one of the moving members 300 to the right and the other to the left, as far apart from each other as possible. This is done to separate each pushing member 310 from the first test tray T1 and each pulling member 320 from the second test tray T2. The second plate 200 (as shown in FIG. 2A) then moves down to move the pushing member 310 and the pulling member 320 to their respective original positions and prepare the second plate 200 for receiving third and fourth test trays (not shown).

The moving members 300 are moved downward, far apart from each other. Thus, the moving members 300 do not collide with the second, third, and fourth test trays. This makes it possible for the moving members 300 to return to their original positions, regardless of a position of the second, third, and fourth test trays.

Figure 5:
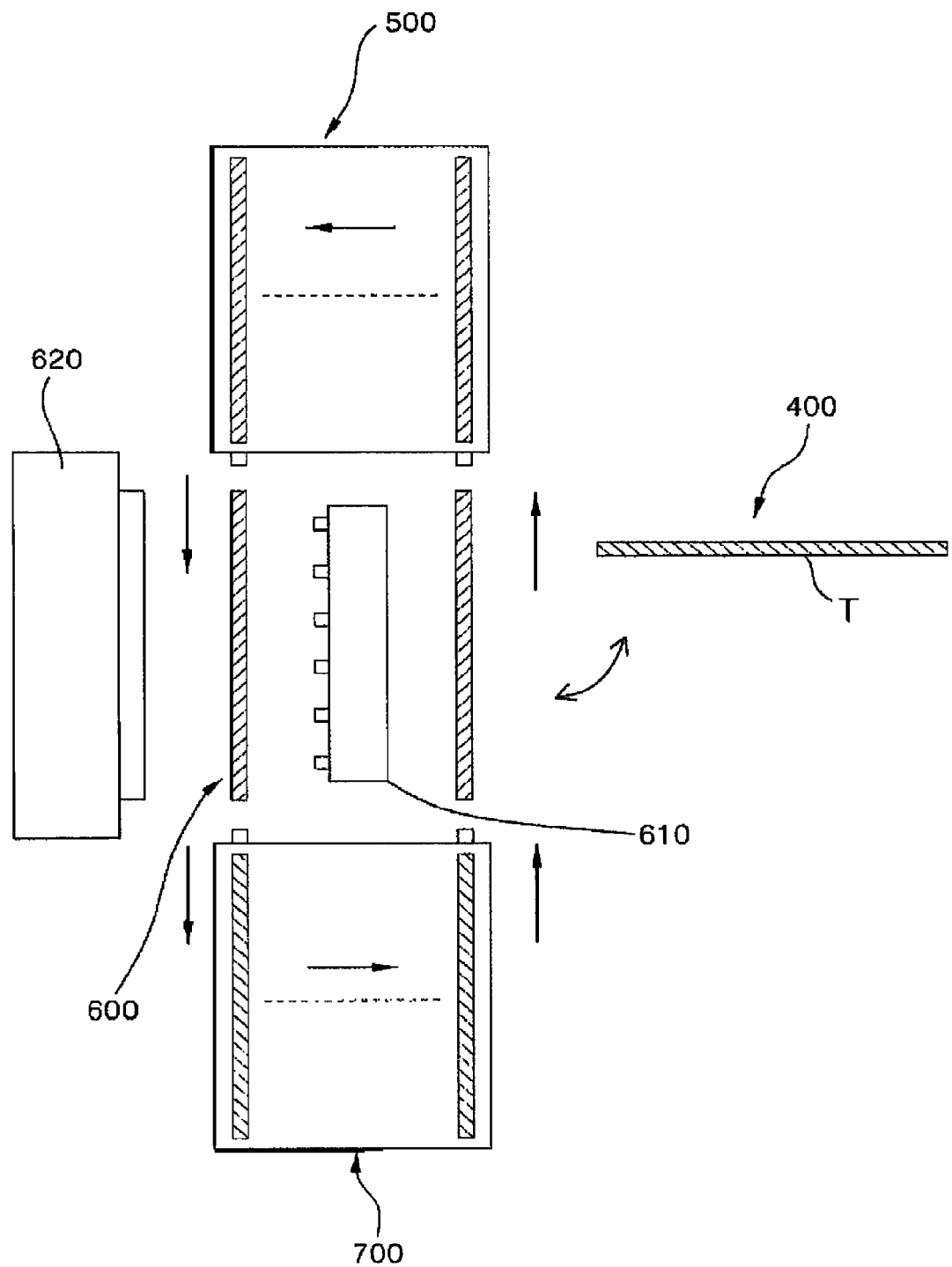
FIG. 5 is a schematic view of a handler according to another embodiment as broadly described herein.

FIG. 5 is a schematic view of a handler according to another embodiment as broadly described herein. The handler shown in FIG. 5 may include a rotating unit 400, a first chamber 500, a second chamber 600, and a third chamber 700. In the embodiment shown in FIG. 5, the first chamber 500, the second chamber 600, and the third chamber 700 are arranged in a column, with the second chamber 600 in between. Other arrangements may also be appropriate.

The rotating unit 400 rotates a horizontally-positioned test tray by 90 degrees to an upright position to transfer the test tray to the first chamber 500. The rotating unit 400 also rotates an upright-positioned test tray, transferred from the third chamber 700, by 90 degrees to make it in the horizontal position. A loading unit and an unloading unit (not shown) may be provided adjacent to the rotating unit 400 to load packaged chips into the test tray and to unload the tested packaged chips from the test tray to corresponding user trays after sorting the tested packaged chips.

The packaged chips contained in the test tray are heated or cooled to extremely high or low temperature as the test tray moves forward (in the direction of the arrow) within the first chamber 500. Within the second chamber 600, the test tray, now containing packaged chips which have been heated or cooled in the first chamber 500, is positioned between a pushing unit 610 and a test board 620. The pushing unit 610 pushes the test tray toward the test board 620 so that the packaged chips make individual contact with corresponding sockets of the test board 620. Thereafter, electrical tests are performed on the packaged chips. The packaged chips are cooled or heated to room temperature as the test tray moves forward within the third chamber 700.

Figure 6:
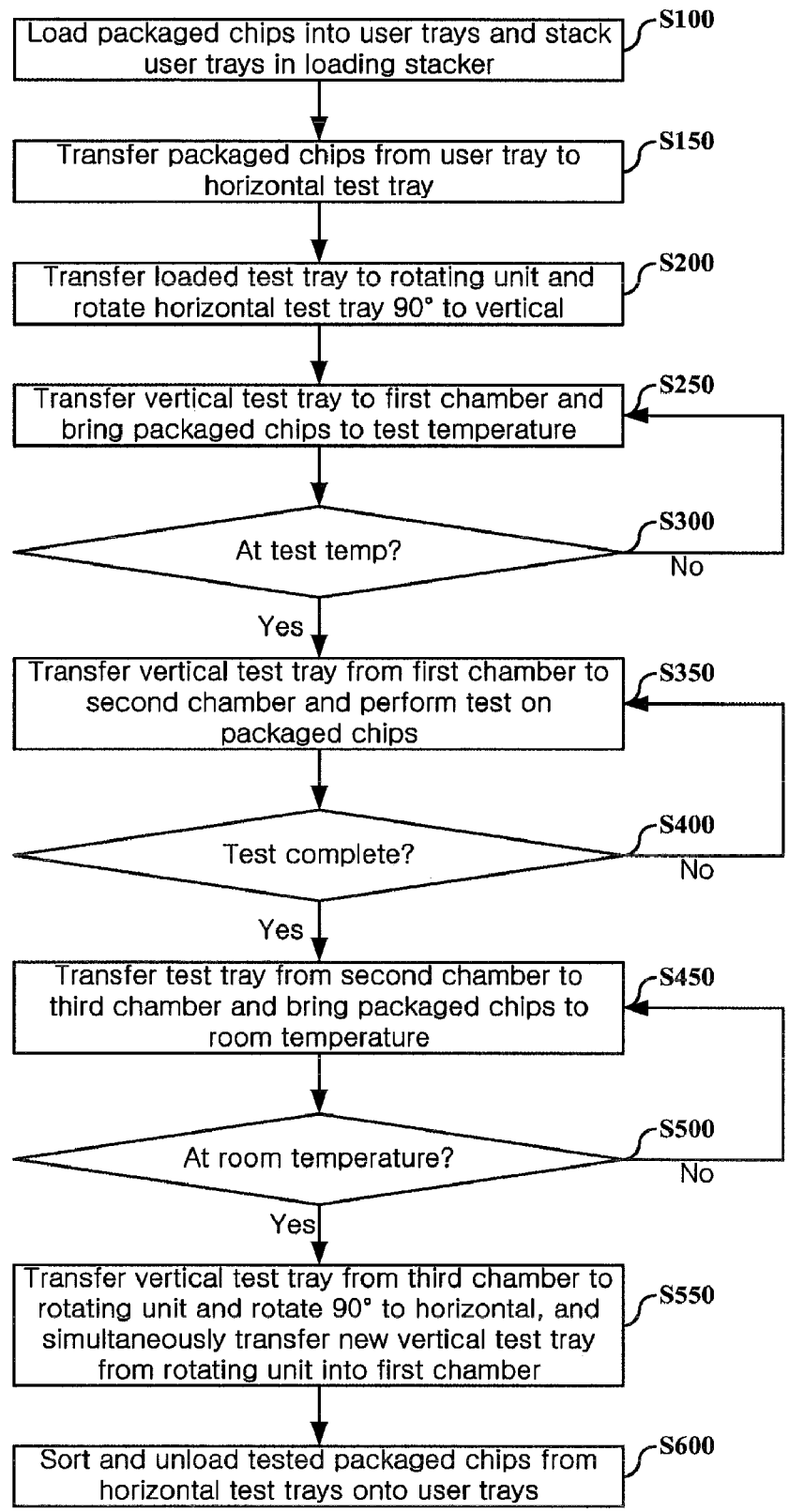
FIG. 6 is a flow diagram illustrating a method of testing packaged chips with test handler.

Thus, two or more test trays containing packaged chips start at the rotating unit 400 and are sequentially processed through the first, second, and third chambers 500, 600 and 700 in this order. The apparatus for transferring test trays shown in FIGS. 2A and 2B may be used with this type of handler. Therefore, a more detailed description of the apparatus for transferring test trays is omitted A process for testing a semiconductor device according to another embodiment as broadly described herein will be discussed with respect to FIG. 6.

Packaged chips are loaded into user trays, and the user trays are stacked in a loading stacker (S100). A loading unit loads packaged chips from the user trays into a horizontally-positioned test tray T (S150). A rotating unit 400 rotates the horizontally-positioned test tray T by 90 degrees to place it in an upright position (S200), as shown in FIG. 5. An apparatus for transferring test trays, such as the apparatus shown in FIGS. 2A-2B, transfers the test tray T, containing the packaged chips to be tested, from the rotating unit 400 into a first chamber 500, where the packaged chips contained in the test tray T are heated or cooled to extremely high or low temperature (S250).

Once the packaged chips are at the desired test temperature (S300), the test tray T is transferred from the first chamber 500 into a second chamber 600. A pushing unit 610 pushes the test tray T toward sockets of a test board 620, causing the packaged chips to come into individual contact with corresponding sockets. An outside tester (not shown) performs tests on the packaged chips in contact with the sockets of the test board 620 (S350).

When the test is complete (S400), the packaged chips are disengaged from the test board 620 and the test tray T is transferred from the second chamber 600 into a third chamber 700, where the packaged chips are cooled or heated to room temperature (S450).

The apparatus for transferring test trays then transfers the test tray T containing room temperature packaged chips from the third chamber 700 to the rotating unit 400 (S550) at the same time a newly loaded test tray is moved from the rotating unit 400 to the first chamber 500.

The rotating unit 400 rotates the upright-positioned test tray T by 90 degrees to a horizontal position. An unloading unit picks up the tested packaged chips from the test tray T, sorts the tested packaged chips according to test results, and places the tested packaged chips into corresponding user trays (S400).

A system and method for transferring test trays containing packaged chips to be tested and test trays containing the tested packaged chips as embodied and broadly described herein decreases processing time and improves efficiency and reliability of the apparatus.

An apparatus that is capable of transferring two test trays at the same time and a handler equipped with such an apparatus is provided.

A process for testing a semiconductor device using a handler equipped with an apparatus capable of transferring two test trays at the same time is also provided.

An apparatus for transferring test trays as embodied and broadly described herein may include at least one moving member including a pushing member pushing first test tray and a pulling member pulling a projection on a second test tray, a second plate to which the at least one moving member is fixed, and a first plate to which the second plate is movably fixed.

An apparatus for transferring test trays as embodied and broadly described herein may include two moving members, each including a pushing member pushing the first test tray and a pulling member pulling a projection on the second test tray, a second plate to which the two moving members are fixed, a first plate to which the second plate is fixed in a manner in which the second plate is ascendable and descendable, and at least one mechanical actuator horizontally moving the two moving members apart from each other or towards each other.

A handler as embodied and broadly described herein may include a loading unit loading packaged chips to be tested into a test tray, an unloading unit unloading the packaged chips from the test tray, a rotating unit rotating the test tray between horizontal and vertical positions, a first chamber where the packaged chips contained in the test tray are heated or cooled to testing temperature, a second chamber where the packaged chips contained in the test tray are in contact with sockets of a test board to receive tests, a third chamber where the tested packaged chips contained in the test tray are cooled or heated to room temperature, and an apparatus for transferring test trays, from the rotating unit into the first chamber and at the same time transferring a test tray containing the tested packaged chips from the third chamber to the rotating unit.

A method for transferring test trays as embodied and broadly described herein may include loading packaged chips to be tested into the test tray, rotating the test tray to an upright position and transferring the test tray from the rotating unit into a first chamber, heating or cooling the packaged chips contained in the test tray to a testing temperature within the first chamber, transferring the test tray from the first chamber into a second chamber, moving the clips into contact with sockets of a test board to perform tests on the packaged chips, transferring the test tray from the second chamber into a third chamber, cooling or heating the tested packaged chips to room temperature within the third chamber, transferring the test tray containing the tested packaged chips from the third chamber to the rotating unit, rotating the test tray containing the tested packaged chips to the horizontal position, unloading the tested packaged chips from the test tray, and transferring the empty test tray from the unloading unit to a loading unit, and wherein at least one moving member transfers a test tray containing the to-be-tested packaged chips from the rotating unit into the first chamber and at the same time, transfers the test tray containing the tested packaged chips from the third chamber to the rotating unit, respectively.

A method for transferring test trays as embodied and broadly described herein may include moving a moving member from a first position to a second position adjacent to the first position, the first position being where the moving member stays when transferring the first test tray and the second test trays at the same time, rotating the first test tray to make the first test tray in the upright position, moving the moving member from the second position to the first position, moving the moving member up to transfer the first test tray and the second test tray at the same time, and moving the moving member from the first position to the second position and moving the moving member down.

A method for transferring test trays as embodied and broadly described herein may include moving two moving members apart from each other, rotating a first test tray to make the first test tray in the upright position, moving the two moving members towards each other, moving the two moving members up to transfer the first test tray and the second test tray at the same time, moving the two moving members apart from each other, and moving the two moving members down.

Any reference in this specification to "one embodiment," "an embodiment," "example embodiment," "certain embodiment," "alternative embodiment," etc., means that a particular feature, structure or characteristic described in connection with the embodiment is included in at least one embodiment as broadly described herein. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although a number of illustrative embodiments have been described, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement which would fall within the scope of the disclosure, the drawings and the appended claims. In addition to variations and modifications in the component parts and/or arrangements, alternative uses will also be apparent to those skilled in the art.

What is claimed is:

1. A handler, comprising:
   a loading unit that loads packaged chips to be tested into test trays;
   an unloading unit that unloads tested packaged chips from test trays;
   a rotating unit that rotates test trays between horizontal and vertical positions;
   a first chamber that receives test trays, containing packaged chips to be tested, from the rotating unit, and that heats or cools the received package chips to a testing temperature;
   a second chamber that receives test trays, containing packaged chips at the testing temperature, from the first chamber, and that brings the received packaged chips into contact with sockets of a test board for testing;
   a third chamber that receives test trays, containing tested packaged chips, from the second chamber, and that heats or cools the received packaged chips to room temperature; and
   an apparatus for transferring a test tray, containing packaged chips to be tested, from the rotating unit into the first chamber and at the same time transferring a test tray, containing tested packaged chips, from the third chamber to the rotating unit.

2. The handler of claim 1, wherein the apparatus for transferring a test tray comprises:
   a first plate;
   a second plate movably coupled to the first plate such that the second plate vertically ascends and descends relative to the first plate;
   at least one moving member coupled to the second plate, each moving member comprising a pushing member that pushes a test tray and a pulling member that pulls a test tray; and
   at least one actuator that moves the at least one moving member in a horizontal direction along the second plate.

3. The handler of claim 1, wherein the apparatus for transferring a test tray comprises:
   a pushing member having a head that pushes a test tray; and
   a pulling member that pulls a test tray, wherein the pulling member has a pocket that engages a projection provided on a test tray.

4. The handler of claim 1, wherein the apparatus for transferring a test tray comprises:
   a first plate;
   a second plate movably coupled to the first plate such that the second plate vertically ascends and descends relative to the first plate;
   two moving members coupled to the second plate, each moving member comprising:
      a pushing member that pushes a test tray; and
      a pulling member that pulls a test tray; and
   at least one actuator that moves the two moving members towards and away from each other.

5. The handler of claim 4, wherein the apparatus for transferring a test tray further comprises:
   a rod that extends between two opposite lower ends of the first plate;
   a pair of pulleys provided at two opposite upper end portions of the first plate;
   a pair of first belts that are each fixed to a corresponding portion of the second plate, and that each extend around a respective pulley and a corresponding portion of the rod; and
   a motor coupled to the rod so as to rotate the rod and the pair of first belts coupled thereto.

6. A method for transferring test trays in a handler, the method comprising:
   loading packaged chips to be tested into a first test tray;
   rotating, in a rotating unit, the first test tray containing the packaged chips to be tested from a horizontal position to an upright position, and transferring the upright first test tray from the rotating unit into a first chamber;
   heating or cooling the packaged chips to be tested to a testing temperature within the first chamber, and transferring the first test tray from the first chamber into a second chamber;
   bringing the packaged chips to be tested into contact with sockets of a test board and testing the packaged chips within the second chamber, and transferring the first test tray from the second chamber into a third chamber;
   cooling or heating the tested packaged chips to room temperature within the third chamber;
   simultaneously transferring the first test tray, containing the tested packaged chips, from the third chamber to the rotating unit, and a second test tray, loaded with packaged chips to be tested, from the rotating unit to the first chamber;

rotating, in the rotating unit, the first test tray containing the tested packaged chips from the upright position back to the horizontal position;

unloading, in an unloading unit, the tested packaged chips from the first test tray; and transferring the empty first test tray from the unloading unit to a loading unit.

7. The method of claim 6, wherein simultaneously transferring the first test tray from the third chamber to the rotating unit and the second test tray from the rotating unit to the first chamber is done by at least one moving member.

8. The method of claim 7, wherein rotating the first test tray containing the packaged chips to be tested to an upright position and transferring the test tray from the rotating unit into a first chamber comprises:

moving the at least one moving member from a first position to a second position adjacent to the first position, wherein the first position is a position at which the at least one moving member is positioned when simultaneously transferring the first test tray and the second test tray;

rotating the first test tray to the upright position;

moving the at least one moving member from the second position to the first position;

moving the at least one moving member up to transfer the first test tray from the rotating unit into the first chamber; and moving the at least one moving member from the first position to the second position and moving the at least one moving member down.

9. The method of claim 7, wherein the at least one moving member comprises two moving members, and wherein rotating the first test tray to the upright position and transferring the first test tray from the rotating unit into a first chamber comprises:

moving the two moving members away from each other;

rotating the first test tray to the upright position;

moving the two moving members toward each other;

moving the two moving members up to transfer the first test tray from the rotating unit into the first chamber; and moving the two moving members away from each other and moving the two moving members down.

10. The method of claim 7, wherein the simultaneously transferring the first test tray and the second test tray comprises:

positioning the at least one moving member between a lower edge of the first tray and an upper edge of the second test tray; and moving the at least one moving member upward so as to simultaneously move the first and second test trays.

11. The method of claim 10, wherein moving the at least one moving member upward comprises pushing, with a head portion of the at least one moving member, against the lower edge of the first test tray, and pulling, with a pocket portion of the at least one moving member, on a position of the second test tray so as to simultaneously move the first and second test trays.

* * * * *